US007405169B2

(12) United States Patent
Lu

(10) Patent No.: US 7,405,169 B2
(45) Date of Patent: Jul. 29, 2008

(54) COMPOSITE MATERIALS AND METHODS OF MAKING THE SAME

(75) Inventor: Jin Lu, North Wales, PA (US)

(73) Assignee: Rohm and Hass Company, Philadelphia, PA (US)

( * ) Notice: Subject to any disclaimer, the term of this patent is extended or adjusted under 35 U.S.C. 154(b) by 121 days.

(21) Appl. No.: 11/543,172

(22) Filed: Oct. 4, 2006

(65) Prior Publication Data

US 2007/0082571 A1 Apr. 12, 2007

Related U.S. Application Data

(60) Provisional application No. 60/725,957, filed on Oct. 12, 2005.

(51) Int. Cl.
*B32B 5/02* (2006.01)
*B32B 9/04* (2006.01)

(52) U.S. Cl. .................. 442/154; 442/157; 428/446; 428/447

(58) Field of Classification Search ................ 442/154, 442/157; 428/446, 447
See application file for complete search history.

(56) References Cited

U.S. PATENT DOCUMENTS 5,151,480 A    9/1992  Podszun et al.
6,811,854 B1   11/2004 Sato et al.
2005/0165154 A1  7/2005  Kosuge et al.
2007/0077837 A1* 4/2007  Lundquist ................... 442/157

FOREIGN PATENT DOCUMENTS

| DE | 19754447 | 6/1999 |
| EP | 1106724 | 6/2001 |
| EP | 0212350 | 3/2004 |
| JP | 60155762 | 8/1985 |
| JP | 60226433 A | 11/1985 |

OTHER PUBLICATIONS

Huang, et al, "Alkoxysilane-Functionalized Acrylic Copolymer Latexes. I. Particle Size Morphology, . . . ", Journal of Applied Polymer Science, vol. 94, 2004, pp. 954-960.
Marcu, et al, "Incorporation of Alkoxysilanes into Model Latex Systems: Vinyl Copolymerization of Vinyltriethoxysilane . . . ", Macromolecules, vol. 36, No. 2, 2003, pp. 328-332.

* cited by examiner

*Primary Examiner*—Lynda Salvatore
(74) *Attorney, Agent, or Firm*—Thomas Deibert

(57) ABSTRACT

Composite materials that contain formaldehyde-free, cured binder compositions are disclosed. Also disclosed are methods of making and using composite materials containing formaldehyde-free binder compositions.

10 Claims, No Drawings

COMPOSITE MATERIALS AND METHODS OF MAKING THE SAME

This application claims the benefit of U.S. patent application No. 60/725,957 filed on Oct. 12, 2005.

The present invention relates to composite materials and methods of making the same. In particular, the present invention relates to composite materials and to methods of making said materials with a formaldehyde-free binder composition.

The preparation of composite materials, for example, fiber structures (e.g., nonwoven fiber insulation) and shaped articles (e.g., fiberboard and chipboard) are conventionally made using phenol-formaldehyde (PF) resins or phenol-formaldehyde resins extended with urea (PFU).

One perceived concern with the use of PF or PFU resins is the potential for formaldehyde emissions during preparation of the resins, during manufacture of composite materials comprising the resins and during subsequent use of those composite materials.

One alternative to PF or PFU resins is disclosed in United States Patent Application Publication No. 2005/0165154 to Kosuge et al. Kosuge et al. disclose a composite comprising a heat-resistant fiber and a siloxane polymer, wherein the siloxane polymer comprises a crosslinked siloxane polymer obtainable by polycondensing a siloxane compound of the following formula

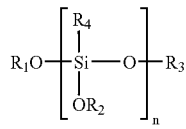

wherein n is an integer of 2 to 10; $R_1$, $R_2$, $R_3$ and $R_4$ may each be the same or different, and may be selected from a hydrogen atom or an alkyl group of 1 to 4 carbon atoms; and each $R_2$ and $R_4$ may each be the same or different for every repetition unit.

Another alternative to PF or PFU resins is disclosed in Japanese Publication No. JP602336433A to Masuji et al. Masuji et al. disclose a binder composition comprising an aqueous dispersion of a copolymer prepared by emulsion copolymerization of a silane compound, a polymerizable unsaturated carboxylic acid and an acrylic acid ester as essential components.

Another alternative to PF or PFU resins is disclosed in Japanese Publication No. JP60155762A. Applicant discloses a composition containing an aqueous copolymer dispersion and an aqueous colloidal silica; wherein the aqueous copolymer dispersion is prepared by emulsion polymerization of a monomer mixture consisting of (a) 0.1 to 40 wt % organic silicon monomer having a polymerizable unsaturated group and a hydrolysable group linked directly to Si in the molecule; (b) 1 to 30 wt % of (meth)acrylic acid alkyl ester with a $C_1$-$C_{18}$ alkyl group; and (c) 0 to 40 wt % of other polymerisable monomers.

Nevertheless, there remains a need for identifying new composite materials that are formaldehyde-free and for new methods of making such composite materials using new formaldehyde-free binder compositions.

In one aspect of the present invention, there is provided a composite material comprising: (a) a substrate material selected from fibers, slivers, chips and combinations thereof; and, (b) a cured binder composition, wherein the cured binder composition is produced from an uncured binder composition comprising a binder copolymer produced by free radical polymerization from (i) component A, wherein component A comprises at least one of a (meth)acrylic acid alkyl ester, styrene, and derivatives thereof; (ii) component B, wherein component B comprises at least one organic silane monomer according to the formula

wherein each $R^a$ is independently selected from methyl, ethyl, propyl, isopropyl, butyl and tert-butyl; and, wherein $R^b$ is selected from any substituted or unsubstituted, ethylenically unsaturated hydrocarbyl group; and, (iii) component C, wherein component C comprises at least one chain transfer agent; wherein the composite material comprises $\leq 40$ wt % cured binder composition; with the proviso that the cured binder composition contains <1 wt % (based on solids) polymerizable unsaturated carboxylic acid monomer derived units and with the proviso that the uncured binder composition contains <0.5 wt % (based on solids) colloidal silica.

In another aspect of the present invention, there is provided a product comprising a composite material of the present invention.

In another aspect of the present invention, there is provided a method for preparing a composite material, comprising: (a) providing an uncured binder composition comprising a binder copolymer produced by free radical polymerization from (i) component A, wherein component A comprises at least one monomer selected from a (meth)acrylic acid alkyl ester, a (meth)acrylic acid alkyl ester derivative, styrene, and a styrene derivative; (ii) component B, wherein component B comprises at least one silane monomer according to the formula

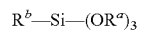

wherein each $R^a$ is independently selected from methyl, ethyl, propyl, isopropyl, butyl and tert-butyl; and, wherein $R^b$ is selected from any substituted or unsubstituted, ethylenically unsaturated hydrocarbyl group; and (iii) component C, wherein component C comprises at least one chain transfer agent; and, (b) providing a substrate material selected from fibers, slivers, chips and combinations thereof; (c) treating the substrate material with the uncured binder composition; and, (d) curing the uncured binder composition; wherein the composite material comprises $\leq 40$ wt % of the cured binder composition; with the proviso that the cured binder composition contains <1 wt % (based on solids) polymerizable unsaturated carboxylic acid monomer derived units and with the proviso that the uncured binder composition contains <0.5 wt % (based on solids) colloidal silica.

The term "emulsion copolymer" as used herein and in the appended claims refers to polymers prepared by emulsion polymerization in an aqueous medium of at least two different monomers.

The glass transition temperature, $T_g$, of a polymer is the temperature at which a polymer transitions from a rigid, glassy state to a fluid or rubbery state. The $T_g$ of a polymer is calculated using the Fox equation. See T. G. Fox, Bull. Am. Physics Soc., Volume 1, Issue No. 3, page 123 (1956).

The term "copolymer" as used herein and in the appended claims refers to polymers prepared using at least two different monomers.

The term "curing" as used herein and in the appended claims means a chemical or morphological change which is sufficient to alter the properties of the uncured binder composition such as, for example, via covalent chemical reaction (e.g., crosslinking), ionic interaction or clustering, improved adhesion to the substrate material, phase transformation or inversion, hydrogen bonding, and combinations thereof.

The term "aqueous" as used herein and in the appended claims means water and mixtures composed substantially of water and water miscible solvents.

The term "formaldehyde-free" as used herein and in the appended claims refers to a composition that is substantially free from formaldehyde, and does not liberate a substantial amount of formaldehyde during drying and/or curing. Typically, less than 1 part per million formaldehyde, based on the weight of the composition, is present in a formaldehyde-free composition.

The term "(meth)acrylic" used herein and in the appended claims encompasses both methacrylic and acrylic.

In some embodiments of the present invention, the composite material comprises 0.5 to 40 wt %, alternatively 1 to 40 wt %, alternatively 1 to 30 wt %, alternatively 1 to 20 wt %, alternatively 2 to 15 wt % of the cured binder composition.

In some embodiments of the present invention, the substrate material is selected from fibers, slivers, chips and combinations thereof. In some aspects of these embodiments, the substrate material is "heat resistant". The term "heat resistant" used herein and in the appended claims, in reference to a substrate material, means that the substrate material is substantially unaffected by exposure to temperatures $\geq 100°$ C., alternatively $\geq 120°$ C., alternatively from $100°$ C. to $350°$ C.; for a period of at least 3 seconds; alternatively of at least 30 minutes.

In some embodiments of the present invention, the substrate material is fibers. In some aspects of these embodiments, the fibers are selected from natural fibers (e.g., sisal, jute, hemp, flax, cotton, coconut fibers, banana fibers); animal fibers (e.g., wool, hair); plastic fibers (e.g., polypropylene fibers, polyethylene fibers, polyvinyl chloride fibers, polyester fibers, polyamide fibers, polyacrylonitrile fibers); glass fibers; glass wool; mineral fibers; mineral wool; synthetic inorganic fibers (e.g., aramid fibers, carbon fibers); and combinations thereof. In some aspects of these embodiments, the fibers may include cellulose fibers, cellulose acetate fibers and fibers of esters and ethers of cellulose. In some aspects of these embodiments, the fibers are selected from mineral fibers, aramid fibers, ceramic fibers, metal fibers, carbon fibers, polyimide fibers, polyester fibers, rayon fibers, glass fibers, glass wool, mineral wool and combinations thereof. In some aspects of these embodiments, the fibers are selected from glass fibers, glass wool, mineral wool and combinations thereof. In some aspects of these embodiments, the fibers are glass fibers. In some aspects of these embodiments, the fibers are heat resistant.

In some embodiments of the present invention, the substrate material is selected from fibers, slivers, chips and combinations thereof, wherein the fibers, slivers and chips are comprised of wood, metal, metal oxides, plastic, minerals, glass and combinations thereof. In some aspects of these embodiments, the fibers, slivers, chips and combinations thereof are heat resistant.

In some embodiments of the present invention, the uncured binder composition has a $T_g$ of $\geq 40°$ C.; alternatively $\geq 60°$ C.; alternatively $\geq 80°$ C.

In some embodiments of the present invention, the binder copolymer comprises 60 to 95 wt % (based on solids) of component A. In some aspects of these embodiments, the binder copolymer comprises 80 to 95 wt % (based on solids) of component A. In some aspects of these embodiments, the binder copolymer composition comprises 85 to 95 wt % (based on solids) of component A.

In some embodiments of the present invention, component A comprises at least one (meth)acrylic acid alkyl ester. In some aspects of these embodiments, the at least one (meth) acrylic acid alkyl ester is selected from methylmethacrylate, ethylacrylate, butylacrylate, butylmethacrylate, or isobutylmethacrylate and combinations thereof.

In some embodiments of the present invention, component B comprises at least one organic silane monomer according to formula

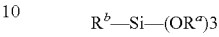

$$R^b\text{—Si—}(OR^a)_3$$

wherein each $R^a$ is independently selected from methyl, ethyl, propyl, isopropyl, butyl and tert-butyl; alternatively $R^a$ is selected from methyl and ethyl; and, wherein $R^b$ is selected from any substituted or unsubstituted, ethylenically unsaturated hydrocarbyl group; alternatively $R^b$ is selected from acrylates and methacrylates; thus, component B may be selected from methacryloxypropyltrimethoxysilane, vinyltrimethoxysilane, vinyltriethoxysilane, allyltrimethoxysilane, allyltriethoxysilane, methacryloxypropyltriethoxysilane, and combinations thereof.

In some embodiments of the present invention, the binder copolymer comprises 5 to 40 wt % (based on solids) of component B. In some aspects of these embodiments, the binder copolymer comprises 5 to 20 wt % (based on solids) of component B.

In some embodiments of the present invention, component C comprises at least one chain transfer agent selected from n-dodecyl mercaptan (n-DDM), methyl-3-mercaptopropionate (MMP), butyl mercaptopropionate (BMP), mercaptopropionic acid (MPA), mercaptoethanol and combinations thereof. In some aspects of these embodiments, component C comprises n-DDM.

In some embodiments of the present invention, the binder copolymer comprises 0.1 to 10 wt % (based on solids) of component C. In some aspects of these embodiments, the binder copolymer comprises 1 to 5 wt % (based on solids) of component C.

In some embodiments of the present invention, the binder copolymer is a core shell copolymer. In some aspects of these embodiments, the component B is concentrated in the shell.

In some embodiments of the present invention, the uncured binder composition contains $\leq 0.45$ wt % (based on solids) colloidal silica. In some aspects of these embodiments, the uncured binder composition contains $\leq 0.4$ wt %; alternatively $\leq 0.3$ wt %; alternatively $\leq 0.25$ wt %; alternatively $\leq 0.2$ wt %; alternatively $\leq 0.1$ wt %; alternatively $\leq 0.05$ wt %; alternatively 0 wt % (based on solids) colloidal silica.

In some embodiments of the present invention, a composite material is provided that comprises: (a) a substrate material selected from fibers, slivers, chips and combinations thereof; and, (b) a cured binder composition, wherein the cured binder composition is produced from an uncured binder composition comprising a binder copolymer produced by free radical polymerization from (i) component A, wherein component A comprises at least one of a (meth)acrylic acid alkyl ester, styrene, and derivatives thereof; (ii) component B, wherein component B comprises at least one organic silane monomer according to the formula

$$R^b\text{—Si—}(OR^a)_3$$

wherein each $R^a$ is independently selected from methyl, ethyl, propyl, isopropyl, butyl and tert-butyl; and, wherein $R^b$ is selected from any substituted or unsubstituted, ethylenically unsaturated hydrocarbyl group; and, (iii) component C, wherein component C comprises at least one chain transfer agent; wherein the composite material comprises ≦40 wt % cured binder composition; with the proviso that the cured binder composition contains <1 wt % (based on solids) polymerizable unsaturated carboxylic acid monomer derived units; with the proviso that the uncured binder composition contains <0.5 wt % (based on solids) colloidal silica; and with the provison that the cured binder composition does not contain units derived from organic silane monomers according to the formula

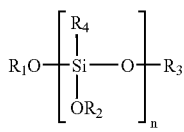

wherein n is an integer of 2 to 10; $R_1$, $R_2$, $R_3$ and $R_4$ may each be the same or different, and may be selected from a hydrogen atom or an alkyl group of 1 to 4 carbon atoms; and each $R_2$ and $R_4$ may each be the same or different for every repetition unit.

In some embodiments of the present invention, the uncured binder composition may further comprise a buffer. In some aspects of these embodiments, the buffer is a pH 7 neutral buffer. In some aspects of these embodiments, the buffer comprises a combination of and $NaHCO_3$ and $NaH_2PO_4$. In some aspects of these embodiments, the buffer consists essentially of a combination of $NaHCO_3$ and $NaH_2PO_4$.

In some embodiments of the present invention, the uncured binder composition may further comprise an accelerator. Accelerators suitable for use with the present invention include any conventional accelerators compatible with the binder copolymer and the substrate material. In some aspects of these embodiments, the uncured binder composition may comprise up to 10 wt %, alternatively 0.01 to 10 wt %, alternatively 0.1 to 5 wt %, alternatively 0.5 to 2 wt % (based on binder solids) of accelerator. In some aspects of these embodiments, the accelerator is selected from a tertiary amine (e.g., benzyl dimethylamine), an imidazole, an imidazoline, an urea, ammonium hydroxide, sodium hydroxide, sodium carbonate, sodium bicarbonate, a boron halide compound and combinations thereof.

In some embodiments of the present invention, the uncured binder composition may further comprise a silane coupling agent. Silane coupling agents suitable for use with the present invention include any conventional silane coupling agents compatible with the binder copolymer and the substrate material. In some aspects of these embodiments, the uncured binder composition may comprise 0.05 to 2 wt %, alternatively 0.1 to 2 wt %, 0.1 to 0.5 wt % (based on solids) of silane coupling agent. In some aspects of these embodiments, the silane coupling agent is selected from aminopropyl silanes, trimethoxy silanes, epoxy containing silanes and combinations thereof. Some representative silane coupling agents include, for example, the organo silicon oils available from Dow-Corning Corporation; A0700, A0750 and A0800 available from Petrarch Systems; A1160 available from Dow Chemical Corporation; Silquest™ A-187 available from GE Silicones—OSi Specialties; and combinations thereof.

In some embodiments of the present invention, the uncured binder composition may further comprise an additive. Additives suitable for use with the present invention include any conventional additives compatible with the binder copolymer and the substrate material. In some aspects of these embodiments, the binder composition may further comprise an optional additive, wherein the additive is selected from accelerators (e.g., phosphorous-containing accelerators); emulsifiers; pigments; fillers; extenders (e.g., urea and carbohydrates such as cellulose and sugar); antimigration aids; curing agents; coalescents; surfactants (e.g., ionic surfactants, nonionic surfactants and zwitterionic surfactants); spreading agents; dust suppressing agents (e.g., mineral oil dust suppressing agents); biocides; plasticizers; organosilanes; antifoaming agents (e.g., dimethicones, silicone oils and ethoxylated nonionics); corrosion inhibitors (e.g., corrosion inhibitors effective at pH<4, e.g., thioureas, oxalates and chromates); colorants; antistatic agents; lubricants; waxes; antioxidants; coupling agents (e.g., organo silicon oils available from Dow-Corning Corporation; A0700, A0750 and A0800 available from Petrarch Systems; A1160 available from Dow Chemical Corporation and Silquest™ A-187 available from GE Silicones—OSi Specialties); polymers; waterproofing agents (e.g., silicones and emulsion polymers, such as emulsion polymers containing, as copolymerized units, greater than 30 wt %—based on the weight of the emulsion polymer solids—ethylenically unsaturated acrylic monomer containing a $C_4$ or greater alkyl group); wetting agents; lignin; and, combinations thereof.

In some embodiments of the present invention, the binder copolymer exhibits a weight average molecular weight of ≦1,000,000; alternatively 1,000 to 1,000,000; alternatively 1,000 to 100,000; alternatively 3,000 to 100,000; alternatively 3,000 to 75,000; alternatively 3,000 to 50,000; alternatively 5,000 to 50,000; alternatively 3,000 to 20,000.

In some embodiments of the present invention, the cured binder composition provides a strong bond with sufficient elasticity and thickness recovery to permit reasonable shipping and in-service deformation of the composite material.

In some embodiments of the present invention, the composite material is moisture resistant so that it does not swell under humid conditions.

In some embodiments of the present invention, the uncured binder composition is odor free and non-corrosive to metals it contacts during processing to prepare the composite materials of the present invention.

In some embodiments of the present invention, the uncured binder composition is formaldehyde-free.

In some embodiments of the present invention, the composite material is formaldehyde-free.

In some embodiments of the present invention, the method for preparing the composite material, comprises: (a) providing a uncured binder composition comprising a binder copolymer produced by free radical polymerization from (i) component A, wherein component A comprises at least one monomer selected from a (meth)acrylic acid alkyl ester, a (meth)acrylic acid alkyl ester derivative, styrene and a styrene derivative; (ii) component B, wherein component B comprises at least one silane monomer according to the formula

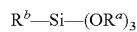

wherein each $R^a$ is independently selected from methyl, ethyl, propyl, isopropyl, butyl and tert-butyl; and, wherein $R^b$ is selected from any substituted or unsubstituted, ethylenically unsaturated hydrocarbyl group; and (iii) component C, wherein component C comprises at least one chain transfer agent; with the proviso that the cured binder composition contains <1 wt % (based on solids) polymerizable unsaturated carboxylic acid monomer derived units and with the proviso that the uncured binder composition contains <0.5 wt % (based on solids) colloidal silica. In some aspects of these embodiments, the binder copolymer comprises 60 to 95 wt %; alternatively 80 to 95 wt %; alternatively 85 to 95 wt % (based on solids) of component A. In some aspects of these embodiments, component A comprises at least one (meth)acrylic acid alkyl ester. In some aspects of these embodiments, the at least one (meth)acrylic acid alkyl ester is selected from methylmethacrylate, ethylacrylate, butylacrylate, butylmethacrylate, isobutylmethacrylate and combinations thereof. In some aspects of these embodiments, the binder copolymer comprises 5 to 40 wt %; alternatively 5 to 20 wt % (based on solids) of component B. In some aspects of these embodiments, component B comprises at least one silane monomer selected from methacryloxypropyltrimethoxysilane, vinyltrimethoxysilane, vinyltriethoxysilane, allyltrimethoxysilane, allyltriethoxysilane, methacryloxypropyltriethoxysilane, and combinations thereof. In some aspects of these embodiments, the binder copolymer comprises 0.1 to 10 wt %; alternatively 1 to 5 wt % (based on solids) of component C. In some aspects of these embodiments, component C comprises at least one chain transfer agent selected from nDDM, MMP, MPA and BMP.

In some embodiments of the present invention, the method for preparing the composite material, comprises: (a) providing an uncured binder composition comprising a binder copolymer produced by free radical polymerization from (i) component A, wherein component A comprises at least one monomer selected from a (meth)acrylic acid alkyl ester, a (meth)acrylic acid alkyl ester derivative, styrene, and a styrene derivative; (ii) component B, wherein component B comprises at least one silane monomer according to the formula

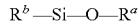

wherein $R^a$ is selected from methyl, ethyl, propyl, isopropyl, butyl and tert-butyl; and, wherein $R^b$ is selected from any substituted or unsubstituted, ethylenically unsaturated hydrocarbyl group; and (iii) component C, wherein component C comprises at least one chain transfer agent; and, (b) providing a substrate material selected from fibers, slivers, chips and combinations thereof; (c) treating the substrate material with the uncured binder composition; and, (d) curing the uncured binder composition; wherein the composite material comprises ≦40 wt % of the cured binder composition; with the proviso that the cured binder composition contains <1 wt % (based on solids) polymerizable unsaturated carboxylic acid monomer derived units; with the proviso that the uncured binder composition contains <0.5 wt % (based on solids) colloidal silica; and with the proviso that the cured binder composition does not contain units derived from organic silane monomers according to the formula

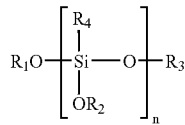

wherein n is an integer of 2 to 10; $R_1$, $R_2$, $R_3$ and $R_4$ may each be the same or different, and may be selected from a hydrogen atom or an alkyl group of 1 to 4 carbon atoms; and each $R_2$ and $R_4$ may each be the same or different for every repetition unit.

In some embodiments of the present invention, the uncured binder composition may be provided as an aqueous solution or aqueous dispersion. In some aspects of these embodiments, the uncured binder composition may further comprise a base or surfactant, which may be added to promote the solubility or dispersibility of the binder copolymer in aqueous solution or aqueous dispersion, respectively. The water present in the uncured binder composition may be substantially removed during processing to prepare the composite material. The removal of the water (drying) may take place in succession with curing or simultaneously with curing. That is, the drying and curing may occur in one process step or in two or more distinct process steps.

In some embodiments of the present invention, the method further comprises: adding a polymerization initiator to the uncured binder composition. In some aspects of these embodiments, the uncured binder composition comprises 0.2 to 1 wt % (based on solids) of polymerization initiator.

In some embodiments of the present invention, the method further comprises: adding an accelerator to the uncured binder composition. In some aspects of these embodiments, the uncured binder composition comprises up to 10 wt %, alternatively 0.01 to 10 wt %, alternatively 0.1 to 5 wt %, alternatively 0.5 to 2 wt % (based on solids) of accelerator.

In some embodiments of the present invention, the method further comprises: adding a silane coupling agent to the uncured binder composition. In some aspects of these embodiments, the uncured binder composition comprises 0.05 to 2 wt %, alternatively 0.1 to 2 wt %, 0.1 to 0.5 wt % (based on solids) of silane coupling agent.

In some embodiments of the present invention, the method further comprises: adding an additive to the uncured binder composition, wherein the additive is selected from any conventional additives compatible with the binder copolymer and the substrate material. In some aspects of these embodiments, the method further comprises: adding an additive to the uncured binder composition, wherein the additive is selected from accelerators (e.g., phosphorous-containing accelerators); emulsifiers; pigments; fillers; extenders (e.g., urea and carbohydrates such as cellulose and sugar); antimigration aids; curing agents; coalescents; surfactants (e.g., nonionic surfactants); spreading agents; dust suppressing agents (e.g., mineral oil dust suppressing agents); biocides; plasticizers; organosilanes; antifoaming agents (e.g., dimethicones, silicone oils and ethoxylated nonionics); corrosion inhibitors (e.g., corrosion inhibitors effective at pH<4, e.g., thioureas, oxalates and chromates); colorants; antistatic agents; lubricants; waxes; antioxidants; coupling agents (e.g., organo silicon oils available from Dow-Corning Corporation; A0700, A0750 and A0800 available from Petrarch Systems; A1160 available from Dow Chemical Corporation and Silquest™ A-187 available from GE Silicones—OSi Specialties); polymers; waterproofing agents (e.g., silicones and emulsion polymers, such as emulsion polymers containing, as copolymerized units, greater than 30 wt %—based on the weight of the emulsion polymer solids—ethylenically unsaturated acrylic monomer containing a $C_4$ or greater alkyl group); wetting agents; lignin; and, combinations thereof.

In some embodiments of the present invention, the uncured binder composition is applied to the substrate material for the purpose of coating the substrate material, sizing the substrate material, saturating the substrate material, bonding the substrate material or a combination thereof.

In some embodiments of the present invention, the uncured binder composition is applied to the substrate material by conventional techniques including, for example, air or airless spraying, padding, saturating, roll coating, curtain coating, beater deposition, coagulation and combinations thereof.

In some embodiments of the present invention, the uncured binder composition is applied to the substrate material in a sufficient amount such that the cured binder composition constitutes 0.5 to 40 wt %, alternatively 1 to 40 wt %, alternatively 1 to 30 wt %, alternatively 1 to 20 wt %, alternatively 2 to 15 wt % of the composite material.

In some embodiments of the present invention, the uncured binder composition is cured in (d) by subjecting the product of (c) to a temperature above 100° C., alternatively 100 to 350° C., alternatively 100 to 300° C., 100 to 250° C., alternatively 125 to 250° C., alternatively 100 to 200° C., alternatively 125 to 200° C.; for a period of ≧3 seconds, alternatively 3 seconds to 30 minutes, alternatively 3 seconds to 15 minutes.

In some embodiments of the present invention, the uncured binder composition is sufficiently stable to facilitate preparation of the uncured binder composition ≧4 hours before application to the substrate material.

In some embodiments of the present invention, the composite material of the present invention may be used as, or in, a variety of products. In some aspects of these embodiments, these products may include, for example, insulation, reinforcing mat for roofing or flooring applications, roving, microglass based material for printed circuit boards, microglass based material for battery separators, filter stock, tape stock, reinforcement scrim for cementitious or non-cementitious masonry coatings, ceiling tiles, cellulosic roofing tiles, window treatments and wall coverings. In some aspects of these embodiments, the product is selected from chipboard, fiberboard, automotive interior lining, insulating material and fiber web material. In some aspects of these embodiments, the product is a "heat resistant product". The term "heat resistant product" as used herein and in the appended claims refers to a product that contains a heat resistant substrate material. In some aspects of these embodiments, the heat resistant product is a "heat resistant fiber insulation product". The term "heat resistant fiber insulation product" as used herein and in the appended claims refers to an insulation product that contains a heat resistant fiber substrate material. In some aspects of these embodiments, the heat resistant fiber insulation product is provided in the form of a mat or blanket. The terms "mat" and "blanket" are used herein and in the appended claims to embrace heat resistant fiber containing composite materials exhibiting a range of different thicknesses and densities. In some embodiments, these mats or blankets may comprise entangling short staple fibers, long continuous fibers or combinations thereof.

Some embodiments of the present invention will now be described in detail in the following Examples. All fractions and percentages set forth below in the Examples are by weight unless otherwise specified.

EXAMPLE 1

Synthesis of 70MMA/10BA/20MATS

To a 1 L, four necked reactor containing a stirrer, condenser, nitrogen inlet was added 100 g water, 2.5 g beta-cyclodextrin, 0.2 g $NaH_2PO_4$ and 0.2 g $NaHCO_3$, with agitation. The contents of the reactor were then heated up to 80° C. with a nitrogen purge and continued agitation (~180 rpm). Sodium persulfate (5 g, 1% solution) was then added to the reactor with continued agitation. After 5 minutes, 45 nm size seed particles were then added to the reactor; followed by a 2 hour cofeed to the reactor of a monomer emulsion and an initiator solution at a rate of 1.39 g/min and 0.34 g/min, respectively. The monomer emulsion was prepared by mixing 35 g water, 0.05 g $NaHCO_3$, 5 g 28% sodium lauryl sulfate, 88 g methyl methacrylate, 12 g butylacrylate, 25 g methacryloxypropyltrimethoxysilane and 1.8 g n-dodecylmercaptan. The initiator solution was prepared by dissolving 0.25 g sodium persulfate in 40 g water. Following the 2 hour cofeed, the contents of the reactor were maintained at 80° C. for 1 hr, with continued agitation. The temperature of the reactor contents was then decreased to 55° C. Then an aqueous solution containing 5 g of $FeSO_4$, 3 g of tertiary butyl hydroperoxide and 0.6 g of hydroxymethane sulfinic acid monosodium salt dihydrate in 15 grams of water was fed to the reactor over a period of 30 minutes. The contents of the reactor were then allowed to cool to room temperature and the product binder copolymer was collected.

EXAMPLE 2

Synthesis of 80MMA/20MATS

To a 1 L, four necked reactor containing a stirrer, condenser, nitrogen inlet was added 100 g water, 2.5 g beta-cyclodextrin, 0.2 g $NaH_2PO_4$ and 0.2 g $NaHCO_3$. The contents of the reactor were then heated up to 80° C. with a nitrogen purge and continued agitation (~180 rpm). Sodium persulfate (5 g, 1%) was then added to the reactor with continued agitation. After 5 minutes, 45 nm size seed particles were then added to the reactor; followed by a 2 hour cofeed to the reactor of a monomer emulsion and an initiator solution at a rate of 1.39 g/min and 0.34 g/min, respectively. The monomer emulsion was prepared by mixing 35 g water, 0.05 g $NaHCO_3$, 5 g 28% sodium lauryl sulfate, 100 g methyl methacrylate, 25 g methacryloxypropyltrimethoxysilane and 1.8 g n-dodecylmercaptan. The initiator solution was prepared by dissolving 0.25 g sodium persulfate in 40 g water. Following the 2 hour cofeed, the contents of the reactor were maintained at 80° C. for 1 hr, with continued agitation. The temperature of the reactor contents was then decreased to 55° C. Then an aqueous solution containing 5 g of $FeSO_4$, 3 g of tertiary butyl hydroperoxide and 0.6 g of hydroxymethane sulfinic acid monosodium salt dihydrate in 15 grams of water was fed to the reactor over a period of 30 minutes. The contents of the reactor were then allowed to cool to room temperature and the product binder copolymer was collected.

EXAMPLE 3

Synthesis of Core-shell Polymer
80(100MMA)/20(20MMA/80MATS)

To a 1 L, four necked reactor containing a stirrer, condenser, nitrogen inlet was added 100 g water, 2.5 g beta-cyclodextrin, 0.2 g $NaH_2PO_4$ and 0.2 g $NaHCO_3$. The contents of the reactor were then heated up to 80° C. with a nitrogen purge and continued agitation (~180 rpm). Sodium persulfate (5 g, 1%) was then added to the reactor with continued agitation. After 5 minutes, 45 nm size seed particles were then added to the reactor; followed by a cofeed of (a) a 90 minute feed of monomer emulsion 1 at a rate of 1.45 g/min; followed by a 30 minute feed of monomer emulsion 2 at a rate of 1.21 g/min; and, (b) a 2 hour feed of an initiator solution at a rate of 0.34 g/min. The monomer emulsion 1 was prepared by mixing 25 g water, 4 g 28% sodium lauryl sulfate, 1 g n-dodecylmercaptan and 100 g methyl methacrylate. The monomer emulsion 2 was prepared by mixing 10 g water, 0.01 g $NaHCO_3$, 1 g sodium lauryl sulfate, 10 g methyl methacrylate, 0.4 g n-dodecylmercaptan and 15 g methacryloxypropyltrimethoxysilane. The initiator solution was prepared by dissolving 0.25 g sodium persulfate in 40 g water. Following the 2 hour cofeed, the contents of the reactor were maintained at 80° C. for 1 hr, with continued agitation. The temperature of the reactor contents was then decreased to 55°

C. Then an aqueous solution containing 5 g of FeSO$_4$, 3 g of tertiary butyl hydroperoxide and 0.6 g of hydroxymethane sulfinic acid monosodium salt dihydrate in 15 grams of water was fed to the reactor over a period of 30 minutes. The contents of the reactor were then allowed to cool to room temperature and the product binder copolymer was collected.

EXAMPLE 4

Synthesis of 80Styrene/20MATS

To a 1 L, four necked reactor containing a stirrer, condenser, nitrogen inlet was added around a ~45 nm size seed particles, 100 g water, 2.5 g beta-cyclodextrin, 0.2 g NaH$_2$PO$_4$ and 0.2 g NaHCO$_3$. The contents of the reactor were then heated up to 80° C. with a nitrogen purge and continued agitation (~180 rpm). Sodium persulfate (5 g, 1%) was then added to the reactor with continued agitation. After 5 minutes, the kettle was cofed for 2 hours a monomer emulsion and an initiator solution at a rate of 1.39 g/min and 0.34 g/min, respectively. The monomer emulsion was prepared by mixing 35 g water, 0.05 g NaHCO$_3$, 5 g 23% sodium dodecyl benzene sulfonate, 88 g methyl methacrylate, 12 g butylacrylate, 25 g methacryloxypropyltrimethoxysilane and 1.8 g n-dodecylmercaptan. The initiator solution was prepared by dissolving 0.25 g sodium persulfate in 40 g water. Following the 2 hour cofeed, the contents of the reactor were maintained at 80° C. for 1 hr, with continued agitation. The temperature of the reactor contents was then decreased to 55° C. Then an aqueous solution containing 5 g of FeSO$_4$, 3 g of tertiary butyl hydroperoxide and 0.6 g of hydroxymethane sulfinic acid monosodium salt dihydrate in 15 grams of water was fed to the reactor over a period of 30 minutes. The contents of the reactor were then allowed to cool to room temperature and the product binder copolymer was collected.

EXAMPLE 5

Mechanical Testing on a Fiberglass Filter Paper Substrate Material

Binder copolymer products prepared according to Examples 1-4 were separately diluted with water to 5% solids. A conventional binder formulation as noted in Table 1 was also tested at 5% solids. Separate glass microfiber filter paper sheets (20.3×25.4 cm, Cat No. 1820 866, Whatman International Ltd., Maidstone, England) were then dipped in the binder solutions and run through a roll padder with a roll pressure of 10 psi at a speed of 5 meter per minute. The coated sheets were then heated at 90° C. for 90 seconds in a Mathis oven. The post drying weight was measured to calculate the binder add-on (dry binder weight as a percentage of filter paper weight) reported in Table 1. The dried sheets were then cured in a Mathis oven at the times and temperatures specified in Table 1.

The cured sheets were then cut into 1 inch (cross machine direction) by 4 inch (machine direction) strips and tested for tensile strength in the machine direction in a Thwing-Albert Intelect 500 tensile tester. The fixture gap was 2 inches and the pull rate was 2 inches/minute. The strips were tested either "as is" (dry tensile) or immediately after a 30 minute soak in water at 85° C. (wet tensile). Tensile strengths were recorded as the peak force measured during parting at 22° C., 55% relative humidity and 760 mm Hg. The experiments were repeated seven times with the average result reported in Table 1.

TABLE 1

| | | | Wet Tensile Strength (lbf/in) | | |
|---|---|---|---|---|---|
| Example | pH | Add-on (%) | 30 sec. Cure at 190° C. | 60 sec. Cure at 190° C. | 180 sec. Cure at 190° C. |
| 1 | 6.8 | 14.40% | 6.16 | 6.07 | 6.18 |
| 2 | 6.7 | 14.10% | 5.82 | 5.77 | 5.24 |
| 3 | 6.5 | 14.50% | 3.96 | 4.07 | 4.17 |
| 4 | 6.5 | 13.70% | 4.24 | 4.22 | 5.18 |
| Conventional Binder Formulation (polyacrylic acid, Mw 4,000 with triethanolamine crosslinker, sodium hypophosphite, and sulfuric acid catalyst) | 3 | 13.40% | 5.02 | 5.79 | 6.34 |

I claim:

1. A composite material comprising:
   (a) a substrate material selected from fibers, slivers, chips and combinations thereof; and,
   (b) a cured binder composition, wherein the cured binder composition is produced from an uncured binder composition comprising a binder copolymer produced by free radical polymerization from
      (i) component A, wherein component A comprises at least one of a (meth)acrylic acid alkyl ester, styrene, and derivatives thereof;
      (ii) component B, wherein component B comprises at least one organic silane monomer according to the formula $R^b$—Si—$(OR^a)_3$ wherein each $R^a$ is independently selected from methyl, ethyl, propyl, isopropyl, butyl and tert-butyl; and, wherein $R^b$ is selected from any substituted or unsubstituted, ethylenically unsaturated hydrocarbyl group; and,
      (iii) component C, wherein component C comprises at least one chain transfer agent;
   wherein the composite material comprises ≦40 wt % cured binder composition; with the proviso that the cured binder composition contains <1 wt % (based on solids) polymerizable unsaturated carboxylic acid monomer derived units and with the proviso that the uncured binder composition contains <0.5 wt % (based on solids) colloidal silica.

2. The composite material of claim 1, wherein the composite material comprises:
   (a) a substrate material selected from fibers, slivers, chips and combinations thereof; and,
   (b) a cured binder composition, wherein the cured binder composition is produced from an uncured binder composition comprising a binder copolymer produced by free radical polymerization from
(i) component A, wherein component A comprises at least one of a (meth)acrylic acid alkyl ester, styrene, and derivatives thereof;
(ii) component B, wherein component B comprises at least one organic silane monomer according to the formula

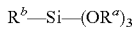

wherein each $R^a$ is independently selected from methyl, ethyl, propyl, isopropyl, butyl and tert-butyl; and, wherein $R^b$ is selected from any substituted or unsubstituted, ethylenically unsaturated hydrocarbyl group; and,
(iii) component C, wherein component C comprises at least one chain transfer agent;
wherein the composite material comprises ≦40 wt % cured binder composition; with the proviso that the cured binder composition contains <1 wt % (based on solids) polymerizable unsaturated carboxylic acid monomer derived units; with the proviso that the uncured binder composition contains <0.5 wt % (based on solids) colloidal silica; and with the proviso that the cured binder composition does not contain units derived from organic silane monomers according to the formula

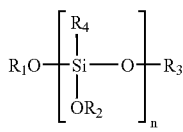

wherein n is an integer of 2 to 10; $R_1$, $R_2$, $R_3$ and $R_4$ may each be the same or different, and may be selected from a hydrogen atom or an alkyl group of 1 to 4 carbon atoms; and each $R_2$ and $R_4$ may each be the same or different for every repetition unit.

3. The composite material of claim 1, wherein component A is selected from methylmethacrylate, ethylacrylate, butylacrylate, butylmethacrylate, or isobutylmethacrylate and combinations thereof.

4. The composite material of claim 1, wherein component B is selected from methacryloxypropyltrimethoxysilane, vinyltrimethoxysilane, vinyltriethoxysilane, allyltrimethoxysilane, allyltriethoxysilane, methacryloxypropyltriethoxysilane and combinations thereof.

5. The composite material of claim 1, wherein component C is selected from n-dodecyl mercaptan, methyl 3-mercaptopropionate, butyl mercaptopropionate.

6. A product comprising the composite material of claim 1.

7. The product of claim 6, wherein the product is selected from chipboard, fiberboard, automotive interior lining, insulating material and fiber web.

8. The product of claim 6, wherein the product is selected from insulation, reinforcing mat for roofing or flooring applications, roving, microglass based substrate material for printed circuit boards, microglass based substrate material for battery separators, filter stock, tape stock, reinforcement scrim for cementitious or non-cemetitious masonry coatings, ceiling tiles, cellulosic roofing tiles, window treatments and wall coverings.

9. A method for preparing a composite material, comprising:
(a) providing an uncured binder composition comprising a binder copolymer produced from (i) component A, wherein component A comprises at least one of a (meth)acrylic acid alkyl ester, styrene, and derivatives thereof;
(ii) component B, wherein component B comprises at least one silane monomer according to the formula

wherein each $R^a$ is independently selected from methyl, ethyl, propyl, isopropyl, butyl and tert-butyl; and, wherein $R^b$ is selected from any substituted or unsubstituted, ethylenically unsaturated hydrocarbyl group; and
(iii) component C, wherein component C comprises at least one chain transfer agent; and,
(b) providing a substrate material selected from fibers, slivers, chips and combinations thereof;
(c) treating the substrate material with the uncured binder composition; and,
(d) curing the uncured binder composition;
wherein the composite material comprises ≦40 wt % of the cured binder composition; with the proviso that the cured binder composition contains <1 wt % (based on solids) polymerizable unsaturated carboxylic acid monomer derived units and with the proviso that the uncured binder composition contains <0.5 wt % (based on solids) colloidal silica.

10. The method of claim 9 where the method comprises:
(a) providing an uncured binder composition comprising a binder copolymer produced from
(i) component A, wherein component A comprises at least one of a (meth)acrylic acid alkyl ester, styrene, and derivatives thereof;
(ii) component B, wherein component B comprises at least one silane monomer according to the formula

wherein each $R^a$ is independently elected from methyl, ethyl, propyl, isopropyl, butyl and tert-butyl; and, wherein $R^b$ is selected from any substituted or unsubstituted, ethylenically unsaturated hydrocarbyl group; and
(iii) component C, wherein component C comprises at least one chain transfer agent; and,
(b) providing a substrate material selected from fibers, slivers, chips and combinations thereof;
(c) treating the substrate material with the uncured binder composition; and,
(d) curing the uncured binder composition;
wherein the composite material comprises ≦40 wt % of the cured binder composition; with the proviso that the cured binder composition contains <1 wt % (based on solids) polymerizable unsaturated carboxylic acid monomer derived units; with the proviso that the uncured binder composition contains <0.5 wt % (based on solids) colloidal silica; and with the proviso that the cured binder composition does not contain units derived from organic silane monomers according to the formula

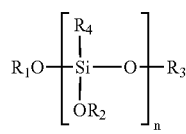

wherein n is an integer of 2 to 10; $R_1$, $R_2$, $R_3$ and $R_4$ may each be the same or different, and may be selected from a hydrogen atom or an alkyl group of 1 to 4 carbon atoms; and each $R_2$ and $R_4$ may each be the same or different for every repetition unit.

* * * * *